US006782329B2

(12) United States Patent
Scott

(10) Patent No.: US 6,782,329 B2
(45) Date of Patent: Aug. 24, 2004

(54) DETECTION OF ARCING FAULTS USING BIFURCATED WIRING SYSTEM

(75) Inventor: Gary W. Scott, Mt. Vernon, IA (US)

(73) Assignee: Square D Company, Palatine, IL (US)

(*) Notice: Subject to any disclaimer, the term of this patent is extended or adjusted under 35 U.S.C. 154(b) by 75 days.

(21) Appl. No.: 09/761,921

(22) Filed: Jan. 17, 2001

(65) Prior Publication Data

US 2001/0029433 A1 Oct. 11, 2001

Related U.S. Application Data

(63) Continuation-in-part of application No. 09/426,832, filed on Oct. 26, 1999, and a continuation-in-part of application No. 09/026,203, filed on Feb. 19, 1998, now Pat. No. 5,986,860.

(51) Int. Cl.$^7$ .................................................. H02H 3/00
(52) U.S. Cl. .......................... 702/58; 702/57; 702/59; 361/45
(58) Field of Search ........................... 702/58, 59, 57, 702/60, 64, 65; 324/536; 335/18; 361/42, 88, 48; 700/293

(56) References Cited

U.S. PATENT DOCUMENTS

| 2,808,566 | A | 10/1957 | Douma | 324/127 |
|---|---|---|---|---|
| 2,832,642 | A | 4/1958 | Lennox | 299/132 |
| 2,898,420 | A | 8/1959 | Kuze | 200/87 |
| 3,471,784 | A | 10/1969 | Arndt et al. | 324/126 |
| 3,538,241 | A | 11/1970 | Rein | 174/143 |
| 3,588,611 | A | 6/1971 | Lambden et al. | 317/31 |
| 3,600,502 | A | 8/1971 | Wagenaar et al. | 174/143 |
| 3,622,872 | A | 11/1971 | Boaz et al. | 324/52 |
| 3,660,721 | A | 5/1972 | Baird | 317/16 |
| 3,684,955 | A | 8/1972 | Adams | 324/72 |
| 3,716,757 | A | 2/1973 | Rodriguez | 317/40 R |
| 3,723,814 | A | * 3/1973 | Gross | 361/45 |
| 3,746,930 | A | 7/1973 | Van Best et al. | 317/31 |
| 3,775,675 | A | 11/1973 | Freeze et al. | 324/51 |
| 3,812,337 | A | 5/1974 | Crosley | 235/153 AC |
| 3,857,069 | A | * 12/1974 | Howell | 361/45 |

(List continued on next page.)

FOREIGN PATENT DOCUMENTS

| CA | 2267490 | 3/1999 | H02H/3/00 |
|---|---|---|---|
| CA | 2256208 | 6/1999 | H01H/9/50 |
| CA | 2256243 | 6/1999 | H02H/3/16 |

(List continued on next page.)

OTHER PUBLICATIONS

JP 06308191, dated Apr. 11, 1994, Abstract.

*Primary Examiner*—Marc S. Hoff
*Assistant Examiner*—Jeffrey R West
(74) *Attorney, Agent, or Firm*—Larry I. Golden

(57) ABSTRACT

A zone arc fault detection system for detecting arcing faults in a defined zone of an electrical circuit, such as an aircraft circuit, includes a pair of substantially identical parallel insulated conductors for each zone in which arcing is to be detected. A detection zone is defined by the parallel conductors between end points where the two conductors are coupled together. A current sensor is operatively associated with each pair of parallel conductors. The current sensor and conductors are respectively configured and arranged such that the current sensor produces a signal representative of a difference in current between the two conductors.

44 Claims, 3 Drawing Sheets

U.S. PATENT DOCUMENTS

| | | | |
|---|---|---|---|
| 3,858,130 A | 12/1974 | Misencik | 335/18 |
| 3,869,665 A | 3/1975 | Kenmochi et al. | 324/72 |
| 3,878,460 A | 4/1975 | Nimmersjo | 324/52 |
| 3,911,323 A | 10/1975 | Wilson et al. | 317/18 |
| 3,914,667 A * | 10/1975 | Waldron | 361/94 |
| 3,932,790 A | 1/1976 | Muchnick | 317/18 D |
| 3,939,410 A | 2/1976 | Bitsch et al. | 324/72 |
| RE28,996 E * | 10/1976 | Morris et al. | 361/45 |
| 4,052,751 A | 10/1977 | Shepard | 361/50 |
| 4,074,193 A | 2/1978 | Kohler | 324/126 |
| 4,081,852 A | 3/1978 | Coley et al. | 361/45 |
| 4,087,744 A | 5/1978 | Olsen | 324/51 |
| 4,156,846 A | 5/1979 | Harrold et al. | 324/158 |
| 4,166,260 A | 8/1979 | Gillette | 335/20 |
| 4,169,260 A | 9/1979 | Bayer | 340/562 |
| 4,214,210 A | 7/1980 | O'Shea | 455/282 |
| 4,233,640 A | 11/1980 | Klein et al. | 361/44 |
| 4,245,187 A | 1/1981 | Wagner et al. | 324/54 |
| 4,251,846 A | 2/1981 | Pearson et al. | 361/30 |
| 4,264,856 A | 4/1981 | Frierdich et al. | 322/25 |
| RE30,678 E | 7/1981 | Van Zeeland et al. | 361/44 |
| 4,316,187 A | 2/1982 | Spencer | 340/664 |
| 4,344,100 A | 8/1982 | Davidson et al. | 361/45 |
| 4,354,541 A | 10/1982 | Tilman | 383/63 |
| 4,356,443 A | 10/1982 | Emery | 324/51 |
| 4,378,525 A | 3/1983 | Burdick | 324/127 |
| 4,387,336 A | 6/1983 | Joy et al. | 324/51 |
| 4,459,576 A | 7/1984 | Fox et al. | 336/84 |
| 4,466,071 A | 8/1984 | Russell, Jr. | 364/492 |
| 4,477,855 A | 10/1984 | Nakayama et al. | 361/54 |
| 4,574,222 A * | 3/1986 | Anderson | 315/254 |
| 4,587,588 A | 5/1986 | Goldstein | 361/54 |
| 4,616,200 A | 10/1986 | Fixemer et al. | 335/35 |
| 4,631,621 A | 12/1986 | Howell | 361/13 |
| 4,639,817 A * | 1/1987 | Cooper et al. | 361/62 |
| 4,642,733 A | 2/1987 | Schacht | 361/656 |
| 4,644,439 A | 2/1987 | Taarning | 361/87 |
| 4,652,867 A | 3/1987 | Masot | 340/638 |
| 4,658,322 A | 4/1987 | Rivera | 361/37 |
| 4,697,218 A | 9/1987 | Nicolas | 633/882 |
| 4,702,002 A | 10/1987 | Morris et al. | 29/837 |
| 4,707,759 A | 11/1987 | Bodkin | 831/642 |
| 4,723,187 A | 2/1988 | Howell | 361/13 |
| 4,771,355 A | 9/1988 | Emery et al. | 361/33 |
| H536 H | 10/1988 | Strickland et al. | 324/456 |
| H538 H | 11/1988 | Betzold | 89/134 |
| 4,810,954 A | 3/1989 | Fam | 324/142 |
| 4,816,958 A | 3/1989 | Belbel et al. | 361/93 |
| 4,833,564 A | 5/1989 | Pardue et al. | 361/93 |
| 4,835,648 A | 5/1989 | Yamauchi | 361/14 |
| 4,839,600 A | 6/1989 | Kuurstra | 324/127 |
| 4,845,580 A | 7/1989 | Kitchens | 361/91 |
| 4,847,719 A | 7/1989 | Cook et al. | 361/13 |
| 4,853,818 A | 8/1989 | Emery et al. | 361/33 |
| 4,858,054 A | 8/1989 | Franklin | 361/57 |
| 4,866,560 A | 9/1989 | Allina | 361/104 |
| 4,878,144 A | 10/1989 | Nebon | 361/96 |
| 4,882,682 A | 11/1989 | Takasuka et al. | 364/507 |
| 4,893,102 A | 1/1990 | Bauer | 335/132 |
| 4,901,183 A | 2/1990 | Lee | 361/56 |
| 4,922,368 A | 5/1990 | Johns | 361/62 |
| 4,931,894 A | 6/1990 | Legatti | 361/45 |
| 4,939,495 A | 7/1990 | Peterson et al. | 337/79 |
| 4,949,214 A | 8/1990 | Spencer | 361/95 |
| 4,969,063 A | 11/1990 | Scott et al. | 361/93 |
| 5,010,438 A | 4/1991 | Brady | 361/56 |
| 5,047,724 A | 9/1991 | Boksiner et al. | 324/520 |
| 5,051,731 A | 9/1991 | Guim et al. | 340/638 |
| 5,121,282 A | 6/1992 | White | 361/42 |
| 5,166,861 A | 11/1992 | Krom | 361/379 |
| 5,168,261 A | 12/1992 | Weeks | 340/515 |
| 5,179,491 A | 1/1993 | Runyan | 361/45 |
| 5,185,684 A | 2/1993 | Beihoff et al. | 361/45 |
| 5,185,685 A | 2/1993 | Tennies et al. | 361/45 |
| 5,185,686 A | 2/1993 | Hansen et al. | 361/45 |
| 5,185,687 A | 2/1993 | Beihoff et al. | 361/45 |
| 5,206,596 A | 4/1993 | Beihoff et al. | 324/536 |
| 5,208,542 A | 5/1993 | Tennies et al. | 324/544 |
| 5,223,795 A | 6/1993 | Blades | 324/536 |
| 5,224,006 A | 6/1993 | MacKenzie et al. | 361/45 |
| 5,257,157 A | 10/1993 | Epstein | 361/111 |
| 5,280,404 A | 1/1994 | Ragsdale | 361/113 |
| 5,286,933 A | 2/1994 | Pham | 218/119 |
| 5,307,230 A | 4/1994 | MacKenzie | 361/96 |
| 5,334,939 A | 8/1994 | Yarbrough | 324/424 |
| 5,353,014 A | 10/1994 | Carroll et al. | 340/638 |
| 5,359,293 A | 10/1994 | Boksiner et al. | 324/544 |
| 5,363,269 A | 11/1994 | McDonald | 361/45 |
| 5,373,241 A | 12/1994 | Ham, Jr. et al. | 324/536 |
| 5,383,084 A | 1/1995 | Gershen et al. | 361/113 |
| 5,388,021 A | 2/1995 | Stahl | 361/56 |
| 5,396,179 A | 3/1995 | Domenichini et al. | 324/546 |
| 5,412,526 A | 5/1995 | Kapp et al. | 361/56 |
| 5,414,590 A | 5/1995 | Tajali | 361/669 |
| 5,420,504 A * | 5/1995 | Berkcan | 324/126 |
| 5,420,740 A | 5/1995 | MacKenzie et al. | 361/45 |
| 5,424,894 A | 6/1995 | Briscall et al. | 361/45 |
| 5,434,509 A * | 7/1995 | Blades | 324/536 |
| 5,444,424 A | 8/1995 | Wong et al. | 335/172 |
| 5,446,431 A | 8/1995 | Leach et al. | 335/18 |
| 5,448,443 A | 9/1995 | Muelleman | 361/111 |
| 5,452,222 A | 9/1995 | Gray et al. | 364/481 |
| 5,452,223 A | 9/1995 | Zuercher et al. | 364/483 |
| 5,459,630 A | 10/1995 | MacKenzie et al. | 361/45 |
| 5,473,494 A | 12/1995 | Kurosawa et al. | 361/3 |
| 5,477,150 A | 12/1995 | Ham, Jr. et al. | 324/536 |
| 5,481,235 A | 1/1996 | Heise et al. | 335/18 |
| 5,483,211 A | 1/1996 | Carrodus et al. | 335/18 |
| 5,485,093 A | 1/1996 | Russell et al. | 324/522 |
| 5,493,278 A | 2/1996 | Mackenzie et al. | 340/638 |
| 5,499,189 A | 3/1996 | Seitz | 364/480 |
| 5,506,789 A | 4/1996 | Russell et al. | 364/492 |
| 5,510,946 A | 4/1996 | Franklin | 361/56 |
| 5,512,832 A | 4/1996 | Russell et al. | 324/522 |
| 5,519,561 A * | 5/1996 | Mrenna et al. | 361/105 |
| 5,531,617 A | 7/1996 | Marks | 439/723 |
| 5,537,327 A | 7/1996 | Snow et al. | 364/483 |
| 5,546,266 A | 8/1996 | Mackenzie et al. | 361/93 |
| 5,561,605 A | 10/1996 | Zuercher et al. | 364/483 |
| 5,568,371 A | 10/1996 | Pitel et al. | 363/39 |
| 5,578,931 A | 11/1996 | Russell et al. | 324/536 |
| 5,590,010 A | 12/1996 | Ceola et al. | 361/93 |
| 5,590,012 A | 12/1996 | Dollar, II | 361/113 |
| 5,602,709 A | 2/1997 | Al-Dabbagh | 361/85 |
| 5,608,328 A | 3/1997 | Sanderson | 324/529 |
| 5,617,019 A | 4/1997 | Etter | 324/117 R |
| 5,638,244 A | 6/1997 | Mekanik et al. | 361/62 |
| 5,642,052 A | 6/1997 | Earle | 324/556 |
| 5,646,502 A | 7/1997 | Johnson | 320/5 |
| 5,657,244 A | 8/1997 | Seitz | 364/492 |
| 5,659,453 A | 8/1997 | Russell et al. | 361/93 |
| 5,661,645 A | 8/1997 | Hochstein | 363/89 |
| 5,682,101 A | 10/1997 | Brooks et al. | 324/536 |
| 5,691,869 A | 11/1997 | Engel et al. | 361/42 |
| 5,701,110 A | 12/1997 | Scheel et al. | 335/132 |
| 5,706,154 A | 1/1998 | Seymour | 361/42 |
| 5,710,513 A | 1/1998 | March | 324/424 |
| 5,726,577 A | 3/1998 | Engel et al. | 324/536 |
| 5,729,145 A | 3/1998 | Blades | 324/536 |
| 5,764,125 A | 6/1998 | May | 336/92 |
| 5,805,397 A | 9/1998 | MacKenzie | 361/42 |

| Patent Number | | Date | Inventor | Class |
|---|---|---|---|---|
| 5,805,398 | A | 9/1998 | Rae | 361/42 |
| 5,812,352 | A | 9/1998 | Rokita et al. | 361/58 |
| 5,815,352 | A | 9/1998 | Mackenzie | 361/42 |
| 5,818,237 | A | 10/1998 | Zuercher et al. | 324/536 |
| 5,818,671 | A | 10/1998 | Seymour et al. | 361/42 |
| 5,825,598 | A | 10/1998 | Dickens et al. | 361/42 |
| 5,834,940 | A | 11/1998 | Brooks et al. | 324/424 |
| 5,835,319 | A | 11/1998 | Welles, II et al. | 361/5 |
| 5,835,321 | A | 11/1998 | Elms et al. | 361/45 |
| 5,839,092 | A | 11/1998 | Erger et al. | 702/58 |
| 5,847,913 | A | 12/1998 | Turner et al. | 361/93 |
| 5,886,861 | A | 3/1999 | Parry | 361/42 |
| 5,889,643 | A * | 3/1999 | Elms | 361/42 |
| 5,894,393 | A * | 4/1999 | Elliott et al. | 361/42 |
| 5,896,262 | A | 4/1999 | Rae et al. | 361/94 |
| 5,905,619 | A * | 5/1999 | Jha | 361/93.6 |
| 5,914,842 | A * | 6/1999 | Sievers | 361/42 |
| 5,933,305 | A | 8/1999 | Schmalz et al. | 361/42 |
| 5,933,308 | A | 8/1999 | Garzon | 361/62 |
| 5,946,179 | A | 8/1999 | Fleege et al. | 361/93 |
| 5,963,406 | A | 10/1999 | Neiger et al. | 361/42 |
| 5,969,920 | A | 10/1999 | Mackenzie | 361/42 |
| 5,982,593 | A | 11/1999 | Kimblin et al. | 361/42 |
| 5,986,860 | A * | 11/1999 | Scott | 361/42 |
| 6,002,561 | A | 12/1999 | Dougherty | 361/42 |
| 6,031,699 | A | 2/2000 | Dollar, II et al. | 361/142 |
| 6,040,967 | A | 3/2000 | DiSalvo | 361/142 |
| 6,052,046 | A | 4/2000 | Ennis et al. | 335/202 |
| 6,084,756 | A | 7/2000 | Doring et al. | 361/45 |
| 6,088,205 | A * | 7/2000 | Neiger et al. | 361/42 |
| 6,128,169 | A * | 10/2000 | Neiger et al. | 361/42 |
| 6,191,589 | B1 | 2/2001 | Clunn | 324/424 |
| 6,198,611 | B1 | 3/2001 | Macbeth | 361/42 |
| 6,215,378 | B1 | 4/2001 | Gibson et al. | 335/18 |
| 6,229,679 | B1 | 5/2001 | Macbeth | 361/42 |
| 6,229,680 | B1 | 5/2001 | Shea | 361/42 |
| 6,232,857 | B1 | 5/2001 | Mason, Jr. et al. | 335/18 |
| 6,300,766 | B1 * | 10/2001 | Schmalz | 324/536 |
| 6,339,525 | B1 * | 1/2002 | Neiger et al. | 361/42 |
| 6,362,629 | B1 * | 3/2002 | Parker et al. | 324/536 |
| 6,407,893 | B1 * | 6/2002 | Neiger et al. | 361/42 |
| 6,504,692 | B1 * | 1/2003 | Macbeth et al. | 361/42 |
| 6,532,140 | B1 * | 3/2003 | McMahon et al. | 361/54 |
| 6,628,487 | B1 * | 9/2003 | Macbeth | 361/42 |
| 6,633,467 | B2 * | 10/2003 | Macbeth et al. | 361/42 |
| 2002/0011832 | A1 * | 1/2002 | Berkcan et al. | 324/127 |

FOREIGN PATENT DOCUMENTS

| | | | |
|---|---|---|---|
| CA | 2277589 | 6/1999 | H02H/3/16 |
| CA | 2265204 | 12/1999 | H01H/83/00 |
| CA | 2305910 | 5/2000 | |
| CA | 2307812 | 10/2000 | |
| EP | 0094871 A1 | 5/1983 | H02H/1/00 |
| EP | 0502393 A2 | 2/1992 | H01H/83/04 |
| EP | 0615327 A2 | 9/1994 | H02H/1/00 |
| EP | 0649207 A1 | 4/1995 | H02H/3/04 |
| EP | 0748021 A1 | 12/1996 | H02H/3/00 |
| EP | 0762591 A2 | 3/1997 | H02H/3/33 |
| EP | 0802602 A2 | 10/1997 | H02H/1/00 |
| EP | 0813281 A2 | 12/1997 | H02H/1/00 |
| EP | 0911937 A2 | 9/1998 | H02H/3/33 |
| EP | 0945949 A2 | 9/1999 | H02H/1/00 |
| EP | 0954003 A2 | 11/1999 | H01H/83/04 |
| EP | 0974995 A2 | 1/2000 | H01H/71/02 |
| EP | 0981193 A2 | 2/2000 | H02H/1/00 |
| EP | 1005129 A2 | 5/2000 | H02H/1/00 |
| GB | 2177561 A | 1/1987 | H20H/3/00 |
| GB | 2215149 A | 9/1989 | H02H/1/06 |
| GB | 2285886 A | 7/1995 | H01H/71/74 |
| JP | 1-158365 | 6/1989 | G01R/15/02 |
| WO | WO 92/08143 | 5/1992 | G01R/31/00 |
| WO | WO 97/30501 | 8/1997 | H02H/1/00 |
| WO | WO00/11696 | 3/2000 | H01H/73/00 |
| WO | WO00/36623 | 6/2000 | H01H/83/04 |
| WO | WO00/39771 | 7/2000 | G08B/21/00 |
| WO | WO01/01536 | 1/2001 | |

* cited by examiner

DETECTION OF ARCING FAULTS USING BIFURCATED WIRING SYSTEM

CROSS-REFERENCE TO RELATED APPLICATION

This patent application is a continuation-in-part of U.S. patent application Ser. No. 09/426,832, filed Oct. 26, 1999 and entitled "Arc Fault Detection System for Aircraft," and a continuation in part of Ser. No. 09/026,203 filed Feb. 19, 1998 now U.S. Pat. No. 5,986,860.

FIELD OF THE INVENTION

This invention is directed generally to the detection of electrical faults and more particularly to the detection of arcing faults in aircraft wiring and the like

BACKGROUND OF THE INVENTION

Aircraft power systems have historically differed from ground based power systems in several ways. The electrical systems in residential, commercial and industrial applications usually include a panelboard for receiving electrical power from a utility source. The power is then routed through protection devices to designated branch circuits supplying one or more loads. These overcurrent devices are typically circuit interrupters such as circuit breakers and fuses which are designed to interrupt the electrical current if the limits of the conductors supplying the loads are surpassed.

Circuit breakers are a preferred type of circuit interrupter because a resetting mechanism allows their reuse Typically, circuit breakers interrupt an electric circuit due to a disconnect or trip condition such as a current overload or ground fault. The current overload condition results when a current exceeds the continuous rating of the breaker for a time interval determined by the trip current. A ground fault trip condition is created by an imbalance of currents flowing between a line conductor and a neutral conductor which could be caused by a leakage current or an arcing fault to ground.

Arcing faults are commonly defined as current through ionized gas between two ends of a broken conductor or at a faulty contact or connector, between two conductors supplying a load, or between a conductor and ground. However, arcing faults may not cause a conventional circuit breaker to trip. Arcing fault current levels may be reduced by branch or load impedance to a level below the trip curve settings of the circuit breaker. In addition, an arcing fault which does not contact a grounded conductor or person will not trip a ground fault protector.

There are many conditions that may cause an arcing fault. For example, corroded, worn or aged wiring, connectors, contacts or insulation, loose connections, damaged wiring, and electrical stress caused by repeated overloading, lightning strikes, etc. These faults may damage the conductor insulation and cause the conductor to reach an unacceptable temperature.

The need for arc detection in aircraft has become increasingly clear. For example, wire arcing may be a factor in some aircraft fires. Past responses to aircraft fires have been to increase the flame retardant properties of wiring and other interior components of aircraft. Standard overcurrent devices used in circuit breakers respond to the heating effect of current in a resistive wire to "thermal trip" the breaker, but these do not respond to the sputtering arc currents which cause intense arc heating and fire.

We propose a better approach—to stop the arc when it happens rather than wait for a fire to start or for a circuit breaker to thermal trip.

Until recently, such arc detection capability has not been available in circuit breakers or relays. Arc detection has been available for 60 Hz residential, commercial or industrial systems, but has not heretofore been resolved for aircraft wiring systems. In addition, most aircraft circuits do not have the neutral return conductor found in 60 Hz systems. This prevents the use of differential detection of ground faults on most aircraft branch circuits. A standard aircraft circuit breaker contains bimetals and/or magnetic solenoids which provide an inverse time response to current. Arcing fault detection is not provided by these devices. Aircraft arc detection is not possible using arc detectors designed for 60 Hz circuits for several reasons. For example, 60 Hz arc detectors partly respond to ground fault which is not possible on standard aircraft branch circuits. Also, the methods used at 60 Hz cannot be automatically extended to cover a power frequency range as high as 400 Hz, typically used in aircraft.

Advancements in electrical circuit protection introduced by the residential and commercial industries have been slow finding their way into aerospace applications. Ground Fault Circuit Interrupters (GFCI) for personnel protection have been available in the home since the early 1970's. Under ideal conditions, GFCI can detect phase to ground arcs as low as six milliamps, but cannot detect series arcs or improve line to neutral fault trip times.

Arc Fault detection technologies are a new and exciting innovation in circuit protection in the U.S. We have found that Arc Fault Circuit Interrupters (AFCI) can be designed to detect a series or parallel arc, as well as line to neutral arcs by "listening" for the unique signatures which arcs generate. We have found that AFCI can detect arc currents well below the trip curves of today's Mil-Spec aircraft circuit breakers. This enhanced detection capability may provide improved protection from arcing conditions onboard aircraft.

An arc fault circuit interrupter is a device intended to provide protection from the effects of arc faults by recognizing characteristics unique to arcing and by functioning to de-energize the circuit when an arc fault is detected.

Aircraft circuit breakers have historically been the best available protection for aerospace wiring. Today's design standards are based on technologies that are up to 40 years old. In aircraft/military type breakers, the protection is provided in two ways. Short circuit currents operate a magnetic trip latch, while overload currents operate either a bimetal trip latch or hydraulic damped magnetic plunger. The "instantaneous trip" is the high current magnetic trip action found on some but not all aircraft breakers. The time to trip during an overload is determined by the time it takes to heat a bimetal to the temperature that delatches the breaker. The more current that heats the bimetal, the shorter the time it takes to trip the breaker. A hydraulic-magnetic style of breaker contains a magnetic slug sealed in fluid which moves to a trip position in response to the square of the current. These circuit interruption devices are selected by aircraft design engineers to protect the aircraft wiring from overheating or melting. During arcing faults these currents are often small, short in duration and well below the overcurrent-time protection curve designed into these breakers.

Arcing in a faulted AC circuit usually occurs sporadically in each half cycle of the voltage waveform. The complex arcing event causes sputtering arcs that vary the current from normal load patterns. The precurser to the arc may be a high resistance connection leading to a "glowing contact" and then a series arc, or a carbon track leading to line-to-line or parallel arcing. In a home circuit breaker equipped with Ground Fault Circuit Interrupter (GFCI), a carbon or moisture track can be detected early if the short is to ground. In many aircraft circuits, the neutral conductor is not available to complete the necessary ground fault detection circuit and GFCI protection is not possible. With the introduction of AFCI breakers, protection of arcing shorts from line-to-line, not involving ground, can also be detected and interrupted.

UL approved AFCI circuit breakers for residental use are available commercially. These are now in the NEC and will be required in home bedroom circuits 2002. Since the electrical loads in residential circuits can vary widely, they will be designed to allow for almost an infinite combination of electrical loads. Their AFCI programming is combined with GFCI as well as magnetic and thermal overload components. They are designed to form fit and function in place of standard residential circuit breakers.

There are two types of arcing faults in aircraft electrical circuits and wiring: Parallel and Series.

Parallel arcing occurs when there is an arc between two wires or wire-to-frame and the current is limited by the impedance of the voltage source, the wire, and the arc. When the fault is solidly connected and the arc voltage low, the normal aircraft breaker trips very quickly with little heating of the wire or damage at the arc point. Occasionally, however, the arc blows apart the faulted components creating a larger arc voltage and reducing the fault current below the trip curve and causing "ticking faults." The consequences of parallel arc damage, are usually much greater than series arcs. The average current may not be sufficient to trip a conventional breaker by heating the bimetal strip or the peak current may not be large enough to trigger the magnetic trip latch. This makes the Mil-Std breaker reasonably effective in protecting against parallel arcing when the peak current is a few hundred amps. Unfortunately, the fault current can be limited by a circuit with too much impedance to immediately trip the thermal-magnetic breaker. Parallel arcing is generally more hazardous than series arcing. The energy released in the arc is much higher with temperatures often in excess of 10,000 Deg. F. This causes pyrolyzation or charring of the insulation, creating conductive carbon paths and ejecting hot metal that is likely to encounter flammable materials.

Series arcing typically begins with corrosion in pin-socket connections or loose connections in series with the electrical loads. The voltage drop across a poor connection begins at a few hundred millivolts and slowly heats and oxidizes or pyrolizes the surrounding materials. The voltage drop increases to a few volts at which time it becomes a "glowing connection" and begins to release smoke from the surrounding polymer insulation. Series arc current is usually limited to a moderate value by the impedance of the electrical load that is connected to the circuit. The amount of power from series arc is typically far is less than in a parallel arc fault. Since the peak current is typically never greater than the design load current, series arcing is much more difficult to detect than parallel arcing. Series arcing is usually such that the arc current remains well below the trip curve of the Mil-Spec aircraft breaker. Loose terminal lugs, misarranged or cross-threaded electrical plugs, broken conductor strands inside a wire are typical sources. These arcs cause load voltage drops and heating of the wire, plug pin, or terminal lug. This heating can lead to component failure and ignition source. Direct Current (DC) arcs are another serious event that can potentially be prevented with AFCI technology.

Care needs to be taken in the adaptation of AFCI into aerospace. Critical and essential electrical circuits need protection which will not nuisance trip. Most aircraft electrical loads are on branched circuits which provide a mixture of current waveforms to the breaker. A single breaker in the cockpit may feed several unrelated systems. Nuisance tripping is not acceptable as several systems may be powered by one breaker. Careful analysis should be used in design and implementation of AFCI technology in aerospace. Even with these reservations, AFCI has the potential to be one of the single largest improvements to aircraft safety in years.

Summarizing briefly, heat, arcs or electrical ignition are often caused by loose connections, broken or shorted wires in the power distribution system. In aircraft wiring, vibration, moisture temperature extremes, improper maintenance and repair all contribute to wiring failure. This leads to arcing and may ignite combustible components. Furthermore, carbon tracking caused by heat generated by the arc can deteriorate the wire insulation, exposing the conductors and resulting in intermittent short circuits between individual wires. These inter-wire shorts can cause damage to delicate avionics and cause system malfunctions in-flight. Elimination or reduction of these hazards to flight with arc fault technology should become an industry-wide priority.

The invention includes an apparatus and method by which arcing is detected in aircraft wiring.

Detection of the above-described sputtering currents caused by arcing is one object of the present invention. A detection signal generated in accordance with the invention can be used to trip a circuit breaker, to indicate arcing to the avionics package, to alert the pilot, or to issue a command to release a control relay.

Electrical arcing has been known to occur in wires of aging aircraft. Various methods of arc detecting circuit breakers and new types of wires have been proposed to reduce the arcing faults. This invention is directed to a new method of wiring and circuit protection which offers several advantages in simplicity and reduced risk in the electronic detection of arcing. The invention is especially useful in aircraft but can be applied in any DC or AC electrical power circuit where the consequences of arcing faults in wires or bus bars is to be prevented.

Ground fault detection has not been an option on single phase aircraft circuits due to the use of the aircraft frame to return neutral current. Neutral conductors on an aircraft would add significant weight to an aircraft and thus typical ground fault sensing is not possible. A ground fault sensor must detect the difference between current supplying and returning from a load. This invention can detect most ground faults to the frame by detecting the difference in fault currents on a bifurcated wire (described below) which occur in conjunction with a fault.

A typical aircraft electrical system includes a 3-phase power supply bus and a DC bus fed by generators or a ground-cart supply. The power buses feed main breakers that feed smaller 3-phase and single-phase branch breakers.

The branch breakers connect to wires that are bundled with other circuit wires and snaked through wire supports to the various electrical loads on the aircraft. Current passes through the load and then typically through a grounding strap to the frame of the aircraft. Neutral conductors are rarely employed to save weight.

Arcing faults have been found to occur at wire-to-terminal points (series faults), pinch points between wire and other objects or wires (parallel faults), and across the surface of connectors in the presence of moisture (parallel faults).

In the prior art of detecting arcing faults, complex algorithms have been necessary to distinguish normal load current transients from arcing faults. This has been due to the fact that the sensor typically detects both the fault current and the load current. In the present invention, a differential sensor does not detect load current, but only the current differences caused by faults. A similar analogy is with ground fault detection methods, which are well known to the industry. Ground path current normally consists of a small capacitive or leakage current, which is easily distinguished from ground faults in low voltage circuits. Unfortunately ground fault detection is not available in most aircraft circuits as weight considerations and minimizing wire weight is a primary design goal. It is an object of this invention to allow rapid arc detection while minimizing the increase in weight due to sensors and wiring.

Another detection system, known popularly as "Smart wire" by Tensolite Company and others, provides a conductive shield or a small gauge wire to be wrapped around the insulation of each current conductor. Any faults in the power wire will likely breach the insulation and produce currents in the sensor wire which are detected by a special circuit which trips the breaker. The disadvantage to this system is the added weight and complexity of the shield wire and the possibility that the shield may become disconnected at some point, unbeknownst to the sensor circuit. The proposed invention herein uses standard aircraft wire without requiring additional copper area for each circuit.

Applied in the DC or AC wiring systems of an aircraft, this invention would increase the safety and useful life of the aircraft. The flight crew will have confidence that a fault will not damage other components.

The invention can be applied to any new circuit where arcing faults are to be avoided. Retrofitting existing circuits would require replacement of each existing wire with a bifurcated wire system, as more fully described below.

Examples of applications include: in-building electrical wiring, power equipment bus bars, generator and motor windings, wiring in explosive atmospheres, mining power cables, vehicle or marine electrical wiring, utility transmission lines, underground or submarine cables, communication wires such as telephone and data communication, or anywhere that multiple wires are used in transmission of power.

OBJECTS AND SUMMARY OF THE INVENTION

It is a general object of the present invention to provide an arc fault detection system and method which reliably detects arc fault conditions which may be ignored by conventional circuit interrupters.

Another object of the invention is to provide an arc fault detection system which overcomes the above-noted problems, yet is relatively simple and yet highly reliable in operation.

Other and further objects and advantages of the invention will be apparent to those skilled in the art from the present specification taken with the accompanying drawings and appended claims.

In accordance with one aspect of the invention, there is provided a zone arc fault detection system for detecting arcing faults in a defined zone of an electrical circuit, such as an aircraft circuit, comprising a pair of substantially identical parallel insulated conductors for each zone in which arcing is to be detected, thereby defining a detection zone comprising the length of said parallel conductors between end points where the two conductors are coupled together, a current sensor operatively associated with each said pair of parallel conductors, said current sensor and said conductors being respectively configured and arranged such that the current sensor produces a signal representative of a difference in current between the two conductors.

DETAILED DESCRIPTION OF THE ILLUSTRATED EMBODIMENT

This invention is an adaptation of one form of the "Differential Phase Arc Detection Method" described in the inventor's prior U.S. Pat. No. 5,986,860. What was disclosed in the patent was a method of detecting series arcing and some parallel arcing including splitting the current into two paths and a unique manner of using a current transformer.

Figure 1:
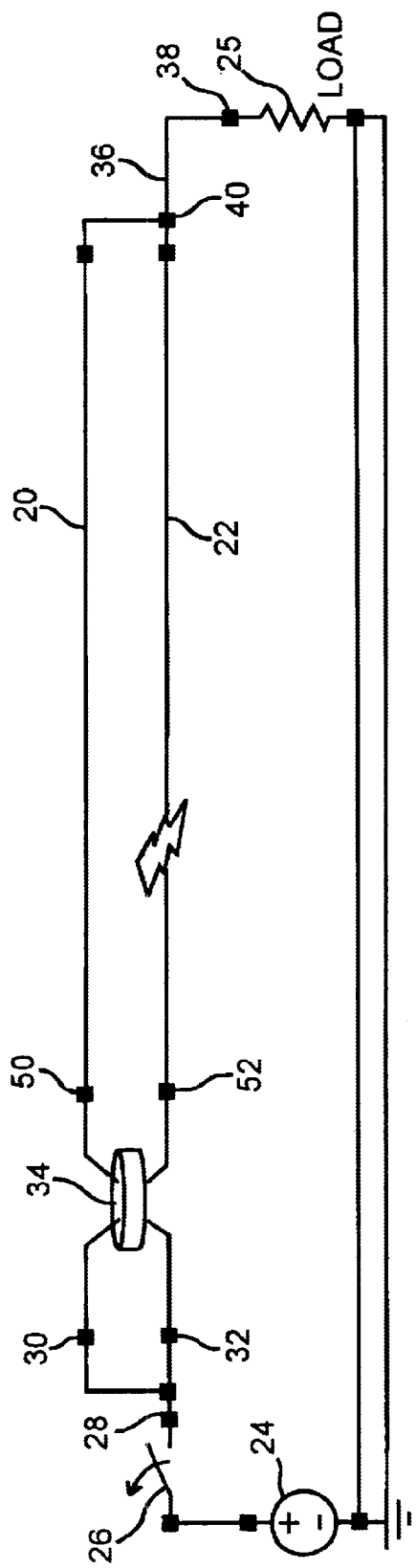
FIGS. 1 and 2 are circuit schematics illustrating arc fault protection for series and parallel arcs respectively, in accordance with embodiments of the invention.
Figure 2:
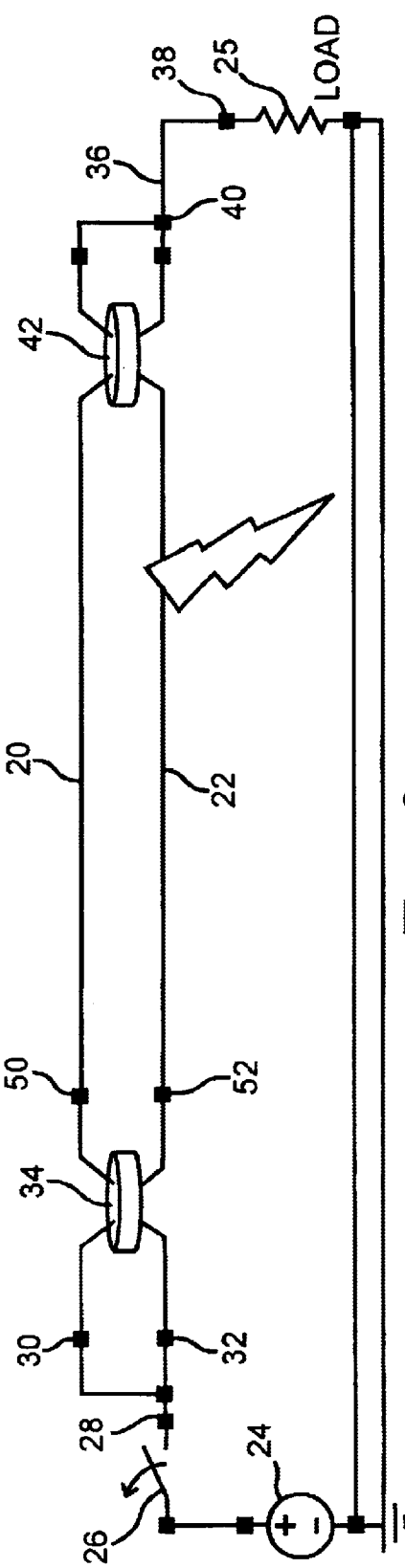

Referring to FIGS. 1 and 2, the method described herein involves first spliting the line or phase current from a source 24 having a circuit breaker 26 into two identical wires e.g., 20, 22 over the length or zone in which arc detection is desired. The two wires each carry essentially half of the total phase current under normal operating conditions. The operating principle is that an electrical load 25 draws equal currents from the two wires (bifurcated wires) unless a fault occurs. Most wire fault modes have been found to generate measurable differences in current magnitude in the two wires.

This invention therefore proposes a deviation from the wiring methods of the past:

In regions or zones of the aircraft (or other DC or AC system) where arc detection is desired, the wires to each load are split into two half sized wires 20, 22. For example, a 10-amp circuit might formerly use one 18AWG aircraft wire to carry current from the circuit breaker to the load. In the proposed invention, this wire is replaced by two 21 or 22 AWG wires that are rated to carry at least 5 amps each.

The circuit breaker 26 supplying the circuit formerly contained one terminal for the incoming wire and one for the outgoing wire to the load. The illustrated embodiment has one terminal 28 for the incoming power wire and two terminals 30, 32 with a differential current sensor 34, operatively coupled with the breaker, for the outgoing wires 20, 22. The breaker 26 functions to protect against both overload current and differential current.

Figure 3:
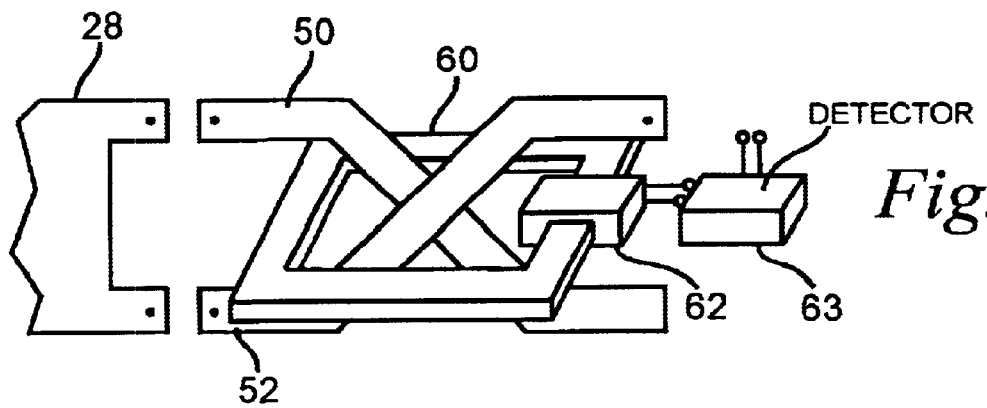
FIG. 3 shows one embodiment of a differential current sensor.

The sensor 34 may be of the configuration shown in FIG. 3 wherein two conductors 50 and 52, which may be rigid busses if desired, are arranged to pass through a magnetic core 60 in such a way that the currents on the two conductors 50 and 52 travel in opposite directions through the core 60. The conductors 50, 52 are connected to the terminals 30, 32 and to the wires 22, 20. The core 60 is provided with a coil 62 on which an output signal is developed which corresponds to any difference in the current between the two conductors 50 and 52. Since identical parallel insulated conductors are used, the output of the coil 62 should be essentially zero in the absence of any arcing faults in the zone. However, any series arc in the connections of one of the conductors of the zone will create or generate a circulating current which will pass through the source tie point, that is, the point at which the conductors 50, 52 are coupled to the source end or input, and also through the arc sensing detection core 60. This circulating current will be detected and a fault will be sensed as the result of an output current on the output coil 62. Line-to-line or line-to-ground faults will generate relatively large fault currents which are sensed directly by the arc detecting magnetic core 60. An arc detector 63 may be coupled with the output coil 62 and this arc detector may respond to the current in the output coil 62 for producing a trip signal to trip the breaker in the event this current exceeds some predetermined threshold value.

This method can also be used for active impedance sensing of the wiring integrity with the wiring either energized or de-energized. An AC signal applied to the coil 62 of the magnetic core 60 can be used to interrogate the total circulating impedance of the phase conductors. An open conductor or unusual increase in resistance will be detected as a corresponding change in the AC signal at the coil 62.

The current carrying bifurcated wires 20, 22 terminate and rejoin to a single conductive path 36 at or near the load terminal 38. The ability to detect arcing faults extends in the zone between the breaker and the terminal 40 where the bifurcated wire becomes one wire.

Referring to FIG. 2, the sensitivity of the differential current sensor to arcing faults may be enhanced by use of an iron core-balancing transformer 42 placed near the load terminal. The effect of the core 42 is to enhance the current differences during a parallel fault. This is accomplished by creating a nonlinear insertion impedance for the current feeding a parallel fault. The balancing core 42 generates a voltage, which partially opposes the current feeding the fault from the unfaulted wire. The balancing core 42 is large enough to allow a detectable current unbalance during a parallel fault but not so large as to counteract the unbalanced current from a series arc and prevent detection by the sensor.

Figure 4:
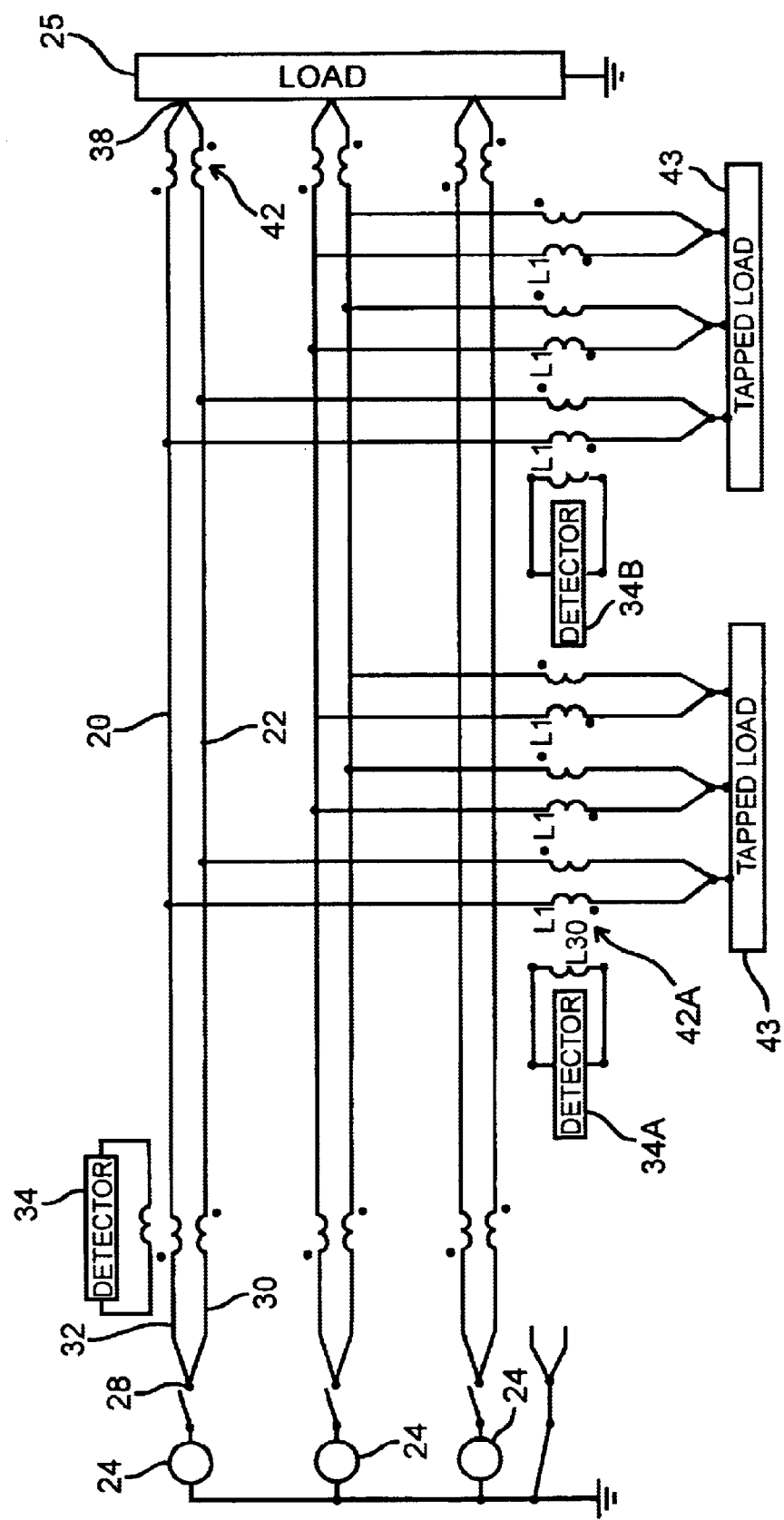
FIG. 4 is a circuit schematic of an embodiment of the invention for accommodating tapped loads.

Referring to FIG. 4, a special case exists if the bifurcated wire system is to be tapped for multiple loads. If it is desired that the zone of arc detection extend to each load, then an iron core balancing core 42a must be attached in each bifurcated wire at each tapped load 43. In this way a series or parallel arc anywhere in the tapped circuit generates a current imbalance which is detected at the source current-difference-detector (differential sensor) 34. If the balancing cores are not used, then a series fault located after the first tap generates a circulating current that is shorted out by the first tap and may not be detected at the detector located at the source breaker. If coordination is desired between the source breaker and a breaker at the load, then a second differential current detector 34a, 34b, etc. is incorporated in the balancing cores at the load with faster trip curves.

Among the novel elements in this invention are one or more of the following:

"Bifurcated" wire comprising two insulated conductors of approximately half the cross-section of the original conductor size required for each circuit to be protected from arcing faults. The bifurcated wire may consist of two identical single wires run loosely together in a bundle or conduit or as a twisted pair, or otherwise.

A novel arc detection breaker containing one of several means to detect both overcurrent and to detect current differences between the conductors of the bifurcated wire system. The proposed breaker contains one terminal for the incoming power wire and two terminals with a differential current sensor associated with or incorporated in the breaker for the outgoing wires.

A current sensor configured to monitor the difference in the current or in the time derivative of current between the two wires.

An optional current balancing iron core to be placed at the load end of the bifurcated wire to increase the sensitivity to parallel arcing faults.

In operation, a series fault is detected thus: a series fault may occur at a point where one wire has broken or passes through a series connection which has deteriorated and offers resistance to the flow of current. The sudden increase in impedance in one wire reduces the current in one wire while increasing the current in the unfaulted wire. The difference in current is detected by a differential current sensor through which the two wires pass. The detected difference in current may be used to illuminate a fault indicator or operate a relay or circuit breaker. By splitting the current into two paths another safety benefit is achieved, the energy of any single series arcing fault is reduced to a miniscule value. The unfaulted wire offers such a low impedance to the load current that a series arc cannot be sustained in the faulted wire. Thus the danger normally associated with a series fault is virtually eliminated. The bifurcated wires eventually reconnect into one conductive path at the terminal of the intended electrical load. The electrical dynamics of the loads produce no nuisance signals on the disclosed current detector and have no effect on the ability to detect a fault. The load cannot produce a transient signal which generates a current difference (or circulating current) in the bifurcated wire. Thus, nuisance tripping is avoided without the use of complex signal identification algorithms.

A parallel fault is detected thus: a fault may occur wherever a conductive material or wire has breached the wire insulation. Fault current passes from the wire to the other conductive structure or wire, often with a sputtering arc. In recent years, many improvements in insulation systems have increased the abrasion protection of wires however this fault mode has not been completely eliminated. Wires continue to be occasionally pinched or cut through by other conductive objects producing a dangerous arc fault current. The use of the disclosed bifurcated wire system is not intended to reduce the probability of this type of fault or to eliminate the arc due to a parallel (shunt) fault. The advantage offered by this invention is the ability to detect this type of fault much more quickly and with more confidence than with previous methods. A prior art overcurrent detection method such as a fuse or circuit breaker contains a built in current-time trip curve based on the assumption that some period of high current often exists for startup of many loads. This invention contains a unique optional feature of an instantaneous trip on any significant difference of current between the bifurcated wires. Any current difference indicates a wire fault is in progress. Load current behaviors cannot generate signals in the differential current sensor 34.

The current sensor 34 which detects the difference in current can be chosen from the following:

An iron core current transformer (one example shown in FIG. 3) wound to produce a current in proportion to the difference in current between the two wires. The iron (high permiability) core current transformer is usable to fault currents down to 20 Hz. The current signal can be used as input into an electronic fault detector circuit or device or to directly operate a relay or circuit breaker device. This type of sensor offers a second option of actively sensing the resistance of the wire. An AC signal can be induced in the sensor by the detection circuit and the loop impedance monitored. The bifurcated wire resistance will increase with temperature due to overcurrent or with series connection degradation.

Figure 7:
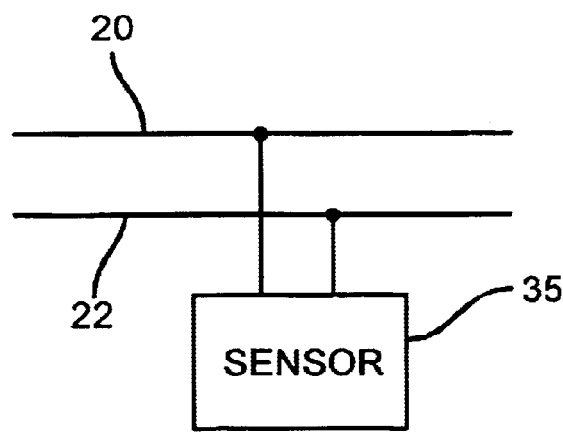

Shown in FIG. 7 is a Hall effect current sensor 35 positioned to detect the DC or AC current differences in the bifurcated wires 20 and 22.

Figure 5:
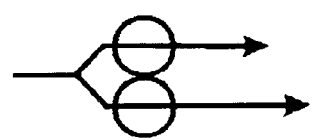
FIGS. 5, 6 and 7 illustrate alternate types of differential current sensors.

An air core toroid (Rogowski coil, see FIG. 5) or low magnetic permability di/dt current sensor is also usable. This type of sensor will produce a signal proportional to the difference between the time derivative of the current in each wire. The signal can be used directly to indicate rapid rise in fault current, or integrated and filtered to produce a signal proportional to the current difference in the bifurcated wires. One advantage of a Rogowski coil is that it can be wound around a flexible core. A flexible sensor can be twisted into a "figure 8" so as to make differential sensing easier around stiff conductors or bus bars.

A resistive shunt can be constructed so as to produce a voltage difference proportional to the bifurcated current difference. The shunt may be a single resistance that is center-tapped to provide current input, and the half-phase wires may be connected to each end terminal of the shunt. The shunt can also be a constructed by geometric shaping of terminals or short lengths of wire to provide two equal impedances.

Figure 6:
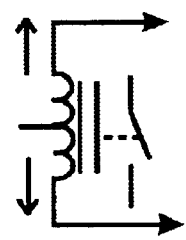

Direct electromagnet sensing (see FIG. 6): The two half-phase wires may be connected to a center tapped solenoid, as shown in FIG. 6, or wound around a magnetic core such that the magnetic fields oppose each other, and the core attracts a magnetic armature in response to the current difference. The armature may be incorporated in a relay or circuit breaker mechanism.

A differential current sensor within a circuit breaker such as bimetal element(s) which produces motion in response to or in proportion to the current difference between the conductors. This type of device would split the current internally in the breaker and contain two terminals for the bifurcated wires.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A zone arc fault detection system for detecting series and parallel arcing faults in a defined zone of an electrical circuit supplying electrical power to a load, comprising:

a single pair of substantially identical parallel insulated load conductors, electrically coupled at a first endpoint and a second endpoint, for each zone in which arcing is to be detected thereby defining a series fault detection zone comprising the length of said parallel conductors between end points where the two conductors are electrically coupled together;

a balancing core operatively associated at said second endpoint with said pair of parallel load conductors; and a current sensor operatively associated at said first endpoint with each said pair of parallel load conductors, thereby defining a parallel fault detection zone between said current sensor and said balancing core, wherein said balancing core induces mutually canceling insertion impedances in said pair of parallel load conductors, and said current sensor produces a signal representative of the difference in the current flow in the two conductors.

2. The system of claim 1 wherein said current sensor comprises a current transformer having a high permeability core.

3. The system of claim 1 wherein said current sensor comprises a Hall effect sensor.

4. The system of claim 1 wherein said current sensor comprises a low magnetic permeability di/dt current sensor.

5. The system of claim 4 wherein said current sensor comprises an air core toroid.

6. The system of claim 5 wherein said current sensor comprises a flexible Rogowski coil formed into a figure 8 configuration.

7. The system of claim 4 wherein the current sensor produces a signal proportional to the difference between the time derivatives of the current in each conductor and further including a circuit for integrating and filtering said sensor signal to produce a signal proportional to the current difference between said conductors.

8. The system of claim 1 wherein said current sensor comprises a resistive shunt constructed so as to produce a voltage difference proportional to the difference in current between said conductors.

9. The system of claim 1 wherein said current sensor comprises a magnetic core and a coil wound around said core, said load conductors being operatively coupled with said coil such that magnetic fields of said conductors oppose each other.

10. The system of claim 9 and further including an armature attracted by said magnetic core in response to a current difference in said conductors.

11. The system of claim 1 wherein said current sensor comprises a differential current sensor which produces a predetermined motion in response to the current difference between the conductors.

12. The system of claim 11 wherein said differential current sensor comprises a bi-metal element.

13. The system of claim 1 and further including a fault detector circuit operatively coupled with said current sensor.

14. The system of claim 13 and further including a circuit breaker responsive to said fault detector circuit.

15. The system of claim 1 and further including a circuit breaker responsive to said differential current.

16. The system of claim 1 and further including a relay operatively coupled with said circuit breaker, said relay being responsive to said differential current for operating said circuit breaker.

17. A method for detecting series and parallel arcing faults in a defined zone of an electrical circuit supplying electrical power to a load, comprising:

splitting a load conductor in each said defined zone into a single pair of substantially identical parallel insulated conductors, and electrically coupling and terminating the endpoints of said conductors together at a first and second endpoint, so that each of said conductors carries substantially half the total phase current during normal operating conditions, thereby defining a series fault detection zone comprising the length of said parallel conductors between the end points where the two conductors are electrically coupled together;

providing a differential current sensor operatively associated at said first endpoint with each said pair of parallel conductors a signal representative of the difference in the current flow of the two conductors; and providing a detectable current unbalance by inducing mutually canceling insertion impedances in said pair of parallel load conductors at said second endpoint during said parallel arcing fault between said current sensor and said mutually canceling insertion impedances.

18. The method of claim 17 wherein said current sensor comprises a current transformer having a high permeability core.

19. The method of claim 17 wherein said current sensor comprises a Hall effect sensor.

20. The method of claim 17 wherein said current sensor comprises a low magnetic permeability di/dt current sensor.

21. The method of claim 20 wherein said current sensor comprises an air core toroid.

22. The method of claim 21 wherein said current sensor comprises a flexible Rogowski coil formed into a figure 8 configuration.

23. The method of claim 20, including producing a signal proportional to the difference between the time derivatives between the current in each conductor and further including integrating and filtering said sensor signal to produce a signal proportional to the current difference between said conductors.

24. The method of claim 17 wherein configuring and arranging said current sensor comprises constructing a resistive shunt so as to produce a voltage difference proportional to the difference in current between said conductors.

25. The method of claim 17 wherein configuring and arranging said current sensor comprises coupling said load conductors with a coil wound around a magnetic core.

26. The method of claim 25 wherein configuring and arranging said current further includes providing an armature attracted by said magnetic core in response to a current difference in said conductors.

27. The method of claim 17 wherein configuring and arranging said current sensor comprises providing a differential current sensor which produces a predetermined motion in response to the current difference between the conductors.

28. The method of claim 27 wherein said differential current sensor comprises a bi-metal element.

29. The method of claim 17 and further including coupling a fault detector circuit with said current sensor.

30. The method of claim 29 and further including providing a circuit breaker coupled for response to said fault detector circuit.

31. The method of claim 17 and further including providing a circuit breaker coupled for response to said differential current.

32. The method of claim 17 and further including operatively coupling a relay with said circuit breaker for responding to said differential current for operating said circuit breaker.

33. The system of claim 1 wherein each of the individual conductors of said pair of load conductors is essentially half the size required of a single load conductor for the total phase current under normal operating conditions of said load.

34. The method of claim 17 wherein each of the individual conductors of said pair of load conductors is essentially half the size required of a single load conductor for the total phase current under normal operating conditions of said load.

35. A zone arc fault detection system for detecting arcing faults in a defined zone of an electrical circuit supplying electrical power to a load, comprising:

a single pair of substantially identical parallel insulated load conductors each of which is essentially half the size required of a single load conductor for the total phase current under normal operating conditions of said load, said load conductors being electrically coupled at a first endpoint and a second endpoint, thereby defining a series fault detection zone between endpoints where the two conductors are electrically connected together;

a balancing core operatively associated at said second endpoint with each said pair of parallel load conductors; and a current sensor operatively associated at said first endpoint with each said pair of parallel load conductors, thereby defining a parallel fault detection zone between said current sensor and said balancing core, said current sensor and said conductors being respectively configured and arranged such that the current sensor produces a signal representative of the difference in the current flow in the two conductors.

36. A system of claim 35 wherein said electrical circuit supplying electrical power to a load is installed in an aircraft.

37. A system of claim 36 and further wherein a conductive frame of said aircraft provides a neutral current return connection.

38. A method for detecting series and parallel arcing faults in a defined zone of an electrical circuit supplying a load, comprising:

splitting a load conductor in each said defined zone into a single pair of substantially identical parallel insulated conductors each of which is essentially half the size required of a single load conductor for the total phase current under normal operating conditions of said load;

electrically coupling each said pair of load conductors at a first endpoint and a second endpoint, thereby defining a series fault detection zone between endpoints where the two conductors are electrically connected together;

providing a current sensor operatively associated at said first endpoint with each said pair of parallel conductors; providing balanced insertion impedances at said second endpoint in said pair of conductors to enhance current unbalance detection during said parallel arcing fault between said current sensor and said balanced insertion impedances; and configuring and arranging a current sensor and said conductors such that the current sensor produces a signal representative of the difference in the current flow of the two conductors.

39. A system of claim 1 wherein said electrical circuit supplying electrical power to a load is installed in an aircraft.

40. A system of claim 39 and further wherein a conductive frame of said aircraft provides a neutral current return connection.

41. A method of claim 17 wherein said electrical circuit supplying electrical power to a load is installed in an aircraft.

42. A method of claim 41 and further wherein a conductive frame of said aircraft provides a neutral current return connection.

43. A method of claim 38 wherein said electrical circuit supplying electrical power to a load is installed in an aircraft.

44. A method of claim 43 and further wherein a conductive frame of said aircraft provides a neutral current return connection.

* * * * *